(12) United States Patent
Kimura

(10) Patent No.: US 6,826,217 B2
(45) Date of Patent: Nov. 30, 2004

(54) SEMICONDUCTOR LASER DEVICE

(75) Inventor: Takashi Kimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/216,319

(22) Filed: Aug. 12, 2002

(65) Prior Publication Data

US 2003/0039288 A1 Feb. 27, 2003

(30) Foreign Application Priority Data

Aug. 13, 2001 (JP) ........................................ 2001-245641

(51) Int. Cl.[7] .............................................. H01S 5/00
(52) U.S. Cl. ........................................... 372/46; 372/45
(58) Field of Search ................................ 372/45–46, 50

(56) References Cited

U.S. PATENT DOCUMENTS

| 5,619,520 A | * | 4/1997 | Sasai et al. ................. 372/46 |
| 5,787,106 A | * | 7/1998 | Tabuchi et al. .............. 372/46 |
| 5,850,411 A | * | 12/1998 | Major et al. ................ 372/45 |
| 5,960,019 A | * | 9/1999 | Hayashi et al. .............. 372/46 |
| 5,982,799 A | * | 11/1999 | Bour et al. .................. 372/50 |
| 6,175,582 B1 | * | 1/2001 | Naito et al. ................. 372/46 |
| 6,414,976 B1 | * | 7/2002 | Hirata ......................... 372/45 |
| 6,424,668 B1 | * | 7/2002 | Murayama .................. 372/46 |
| 6,426,967 B1 | * | 7/2002 | Tanabe ........................ 372/46 |
| 6,606,334 B1 | * | 8/2003 | Shigihara et al. ............ 372/45 |
| 6,618,417 B2 | * | 9/2003 | Ohkubo et al. .............. 372/46 |

* cited by examiner

Primary Examiner—Minsun Oh Harvey
Assistant Examiner—James Menefee
(74) Attorney, Agent, or Firm—Rabin & Berdo, P.C.

(57) ABSTRACT

A semiconductor laser device including a lower cladding layer stacked on a compound semiconductor substrate, an active layer stacked on the lower cladding layer, an upper first cladding layer stacked on the active layer, a ridge-shaped upper second cladding layer provided on the upper first cladding layer, current blocking layers provided on both sides of the upper second cladding layer, and a contact layer provided on the upper second cladding layer. The distance between the upper surface of the active layer and the upper surface of the upper second cladding layer is shorter than the distance between the lower surface of the lower cladding layer and the lower surface of the active layer.

9 Claims, 2 Drawing Sheets

SEMICONDUCTOR LASER DEVICE

BACKGROUND OF THE INVENTION

1. Field of the Invention

The present invention relates to a semiconductor laser device used for optical disk apparatus such as a CD-R/RW drive, a DVD-RAM drive, a MD drive and the like.

2. Description of Related Art

It has been tried to increase the recording speed of optical recording apparatuses, and, for example, CD-drives of 16-time speed recording have been put into practical use. In such an optical recording apparatus of a high recording speed, it is necessary to momentarily start up high output laser light emitting. As examples of laser devices capable of fulfilling such required characters, there are ridge type semiconductor laser devices.

FIG. 3 is a schematic sectional view of a conventional ridge type semiconductor laser device, showing a section perpendicular to the longitudinal direction of the device.

On a substrate 31, a lower cladding layer 32, an active layer 33 and an upper first cladding layer 34 are stacked in this order. On the upper first cladding layer 34, a ridge-shaped upper second cladding layer 37 is formed so as to extend in the longitudinal direction of the device. On both sides of the upper second cladding layer 37, current blocking layers 36 are formed. On the upper second cladding layer 37 and the current blocking layers 36, a contact layer 38 is formed in ohmic contact with the upper second cladding layer 37.

On the lower surface of the substrate 31 and the upper surface of the contact layer 38, n-side electrodes and p-side electrodes (not shown) are formed respectively.

At the time of laser light emission, electrons recombine with holes in the active layer 33 to emit light. When the substrate 31 and the contact layer 38 are formed of GaAs and the lower cladding layer 32, the active layer 33, the upper first cladding layer 34 and the upper second cladding layer 37 are formed of AlGaAs based materials, the laser light can pass portions formed of AlGaAs based materials. Within these portions, the laser light is distributed in the form of a beam. The sectional form of a laser beam LB3 at an end face of the device is shown in FIG. 3.

FIG. 4 is an enlarged schematic sectional view showing the structure in the vicinity of the active layer 33 of the ridge type semiconductor laser device of FIG. 3.

Between the lower cladding layer 32 and the active layer 33, a lower beam enlargement layer 41 is provided. Between the active layer 33 and the upper first cladding layer 34, an upper beam enlargement layer 42 is provided. By setting the refractive indexes of the lower beam enlargement layer 41 and the upper beam enlargement layer 42 to suitable values respectively, a laser beam LB3 is enlarged by suitable widths in upward and downward directions from the active layer 33 respectively. Usually, the upper and the lower beam enlargement layers 41 and 42 are so designed that the laser beam LB3 can be enlarged by substantially equal widths both in the upward and downward directions from the active layer 33 respectively.

The distance L3 between the lower surface of the lower cladding layer 32 and the lower surface of the active layer 33 is so set that the lower end of the laser beam LB3 is positioned in the vicinity of the lower surface of the lower cladding layer 32. Similarly, the distance L4 between the upper surface of the active layer 33 and the upper surface of the upper second cladding layer 37 is so set that the upper end of the laser beam LB3 is positioned in the vicinity of the upper surface of the upper second cladding layer 37. The distances L3 and L4 are substantially equal to each other. When the substrate 31 and the contact layer 38 are formed of materials capable of absorbing the laser beam LB3, the length from the lower end to the upper end of the laser beam LB3 (hereinafter referred to as "longitudinal beam diameter") is set to be shorter than the distance between the lower surface of the lower cladding layer 32 and the upper surface of the upper second cladding layer 37. Thus, the laser beam LB3 can be prevented from being absorbed.

The current injection from the upper second cladding layer 37 into the active layer 33 occurs through the lower surface of the upper second cladding layer 37. Therefore, in the active layer 33, the recombination of electrons and carriers of holes causes light emission in a region E3 (hereinafter referred to as "light emission region E3") having a width substantially equal to the width S3 of the lower surface of the upper second cladding layer 37 (hereinafter referred to as "injection current width S3"). In this case, carriers are not consumed uniformly throughout the light emission region E3 but consumed in a larger amount in a portion in the vicinity of the center, in the direction of the width, of the light emission region E3.

Though the amount of carrier consumption is nonuniform as mentioned above, the carrier density in the light emission region E3 can be kept uniform to some extent by diffusion of carriers (especially minority carriers). However, when the operation current is enhanced in order to obtain a high optical output, carriers cannot be sufficiently complemented by diffusion in case of the injection current width S3 being large. As a result, the carrier density becomes nonuniform in the direction of the width of the light emission region E3, and consequently the brightness distribution becomes nonuniform. That is, in the light emission region E3, the portion of light emission at a high brightness moves to a portion having a high carrier density, and consequently, the optical output becomes unstable. Since laser devices having unstable optical output cannot be used for optical recording and optical reading, the maximum rated optical output is determined within a range in which the optical output is stable.

By narrowing the injection current width S3, the problem of the nonuniform carrier density can be solved. That is, by making the injection current width S3 smaller than the distance of the carrier diffusion in the active layer 33 (carrier diffusion length), the portion in which a large amount of carriers are consumed is surely supplemented with minority carriers, so that uniform light emission in the light emission region E3 can be obtained. With such a structure, the optical output can be stabilized, whereby the maximum rated optical output of the laser device can be increased.

However, as the injection current width S3 is made narrower, the upper surface width D3 of the upper second cladding layer 37 also becomes narrow. The reason is that, since the side surfaces of the upper second cladding layer 37 are formed with a given inclination angle, the injection current width S3 and the upper surface width D3 cannot be separately changed in case of the thickness of the upper second cladding layer 37 being fixed. Since the current flows through the boundary surface between the contact layer 38 and the upper second cladding layer 37, the area of the boundary surface between the contact layer 38 and the upper second cladding layer 37 becomes small when the upper surface width D3 becomes narrow, so that the resistance value of the laser device rises.

SUMMARY OF THE INVENTION

An object of the present invention is to provide a semiconductor laser device capable of raising the maximum rated optical output without increasing the device resistance.

A semiconductor laser device according to the present invention includes a lower cladding layer, an active layer and an upper first cladding layer stacked in this order on a compound semiconductor substrate, a ridge-shaped upper second cladding layer provided on the upper first cladding layer, current blocking layers provided at the sides of the upper second cladding layer, and a contact layer provided on the upper second cladding layer. The distance between the upper surface of the active layer and the upper surface of the upper second cladding layer is shorter than the distance between the lower surface of the lower cladding layer and the lower surface of the active layer.

Laser light can pass through each of the layers from the lower cladding layer to the upper second cladding layer. The distance between the lower surface of the lower cladding layer and the upper surface of the upper second cladding layer is hereinafter referred to as "passable layer thickness".

According to the present invention, the distance between the upper surface of the active layer and the upper surface of the upper second cladding layer is shorter than the distance between the lower surface of the lower cladding layer and the lower surface of the active layer. Therefore, the thickness of the upper second cladding layer according to the present invention can be designed thinner than that of a conventional device without changing the passable layer thickness. As a result, even if the injection current width according to the present invention is made narrower than that of the conventional device, the upper surface width of the upper second cladding layer can be of a size similar to that of the conventional device.

Therefore, by narrowing the injection current width, the nonuniform carrier density in the light emission region can be reduced without increasing the device resistance. Thereby, it is possible to enlarge the operation range in which the optical output is stable, so that the maximum rated optical output can be raised.

In order to making the passable layer thickness to be of a size similar to that of the conventional device, the thickness of the lower cladding layer has only to be made thicker than that of the conventional device. Thereby, the longitudinal beam diameter of the laser beam distributed in the passable layer thickness can be of a size similar to that of the conventional device.

In addition to the upper first cladding layer, other layers may be provided between the active layer and the upper second cladding layer. For example, an etching stop layer used for forming the upper second cladding layer into a ridge shape may be provided between the upper first cladding layer and the upper second cladding layer.

It is preferable that the bottom surface width of the upper second cladding layer is smaller than the diffusion length of carriers in the active layer. By making the injection current width smaller than the diffusion length of carriers, the region in the active layer in which many carriers are consumed is surely supplemented with minority carriers, so that uniform light emission can be obtained in the light emission region. As a result, the optical output can be stabilized, therefore; the maximum rated optical output can be raised.

It is preferable that a lower beam enlargement layer, having a refractive index lower than each of the refractive indexes of the lower cladding layer and the active layer, is provided between the lower cladding layer and the active layer. Further, it is preferable that an upper beam enlargement layer, having a refractive index lower than each of the refractive indexes of the active layer and the upper first cladding layer, is provided between the active layer and the upper first cladding layer, When the refractive index of the upper beam enlargement layer and the refractive index of the lower beam enlargement layer are lower than that of the upper first cladding layer and that of the lower cladding layer respectively, the laser beam is enlarged by suitable widths in the upward and downward directions respectively from the active layer.

When, in a structure of a conventional ridge type semiconductor laser device, an upper second cladding layer is made to have a smaller thickness, the upper end of a laser beam reaches, beyond the upper surface of an upper second cladding layer, a region in which a contact layer exists. For example, an active layer, an upper first cladding layer and the upper second layer are formed of AlGaAs based material and the contact layer is formed of GaAs, a laser beam entering the contact layer is absorbed. Therefore, a laser beam generated in the active layer cannot be efficiently taken out of the device. Further, the laser beam taken out of the device cannot have a predetermined longitudinal beam diameter.

According to the present invention, a laser beam can be distributed narrower in the upward direction from the active layer than in the downward direction therefrom by means of the upper beam enlargement layer and the lower beam enlargement layer. Therefore, even if the upper second cladding layer has a small thickness, a laser beam enlarged in the upward direction from the active layer can be prevented from reaching the contact layer beyond the upper surface of the upper second cladding layer. That is, since the laser light is not absorbed by the contact layer, the laser beam can be efficiently taken out of the device.

Further, it is possible to make the distance between the lower surface of the lower cladding layer and the lower surface of the active layer longer than that of a conventional device and thereby to widely distribute the laser beam in the downward direction from the active layer, so that the passable layer thickness and the longitudinal beam diameter of the sizes respectively similar to those of the conventional device can be achieved.

It is preferable that the difference between the refractive indexes of the lower cladding layer and the lower beam enlargement layer is larger than the difference between the refractive indexes of the upper first cladding layer and the upper beam enlargement layer.

The smaller the difference between the refractive indexes of the upper beam enlargement layer and the upper first cladding layer becomes, the smaller the upwardly enlarged width of the laser beam becomes. The smaller the difference between the refractive indexes of the lower beam enlargement layer and the lower cladding layer becomes, the smaller the downwardly enlarged width of the laser beam becomes. Therefore, by making the difference between the refractive indexes of the lower beam enlargement layer and the lower cladding layer larger than the difference between the refractive indexes of the upper beam enlargement layer and the upper first cladding layer, the laser beam can be distributed more widely in the downward direction than in the upward direction from the active layer.

It is preferable that the thickness of the lower beam enlargement layer is larger than that of the upper beam enlargement layer. The larger the thicknesses of the lower beam enlargement layer and the upper beam enlargement layer are, the larger the enlarged width of the laser beam becomes. Therefore, by making the thickness of the lower beam enlargement layer larger than that of the upper beam enlargement layer, the laser beam can be distributed more widely in the downward direction than in the upward direction from the active layer.

The compound semiconductor substrate may be a GaAs compound semiconductor, and the lower cladding layer may be an $Al_{x1}Ga_{(1-x1)}$ As layer.

The active layer may be a single layer of $Al_{y1}Ga_{(1-y1)}$ As or a composite layer of an $Al_{y11}Ga_{(1-y11)}$ As layer and an $Al_{y12}Ga_{(1-y12)}$ As layer (for example, obtained by alternately stacking these two kinds of layers), or a composite layer of an $Al_{y1}Ga_{(1-y12)}$ As layer and a GaAs layer (for example, obtained by alternately stacking these two kinds of layers). When the active layer is a MQS (Multi Quantum Well) active layer, it may be such a composite layer as mentioned above.

The upper first cladding layer may be an $Al_{x2}Ga_{(1-x2)}$ As layer. The ridge-shaped upper second cladding layer may be an $Al_{x3}Ga_{(1-x3)}$ As layer, and the current blocking layer may be an $Al_{y2}Ga_{(1-y2)}$ As layer or a GaAs layer. The contact layer may be a GaAs layer.

The lower beam enlargement layer may be an $Al_{z1}Ga_{(1-z1)}$ As layer and the upper beam enlargement layer may be an $Al_{z2}Ga_{(1-z2)}$ As layer.

In a process of manufacturing such a semiconductor laser device, after forming the lower cladding layer, only by continuously stacking a layer of the AlGaAs based material with altering the Al content of the layer, the lower beam enlargement layer can be formed. Similarly, after forming the upper first cladding layer, only by continuously stacking a layer of the AlGaAs based material with altering the Al content of the layer, the upper beam enlargement layer can be formed. In an AlGaAs based material, the higher the Al content becomes, the lower the refractive index becomes. Therefore, by controlling the Al content, the refractive index of each part formed of an AlGaAs based material can be set to a desired value.

The above-mentioned and other objects, features and effects of the present invention will become more apparent from the following description of the embodiments given with reference to the appended drawings.

DESCRIPTION OF THE PREFERRED EMBODIMENTS

Figure 1:
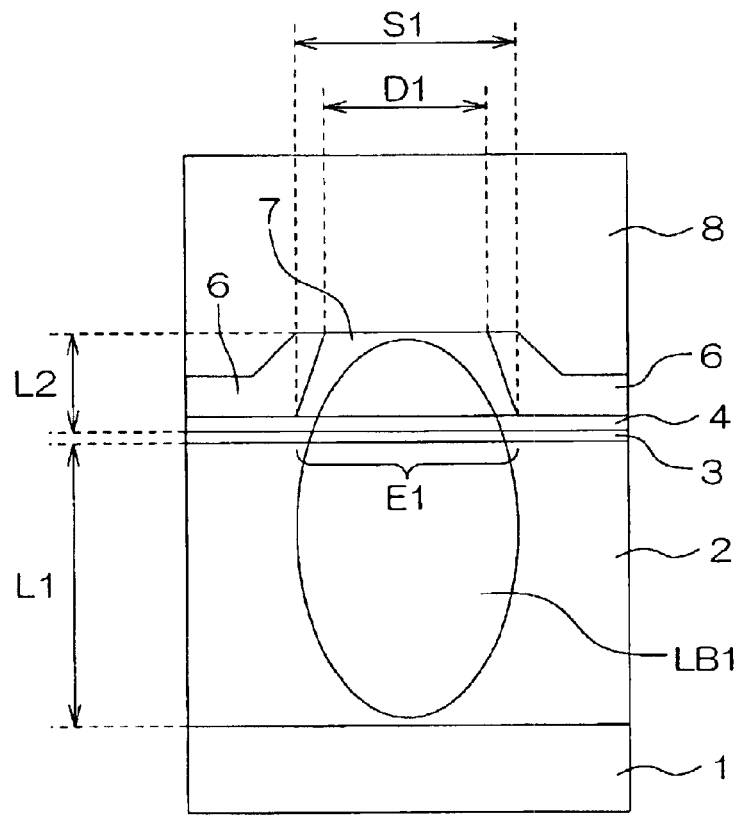
FIG. 1 is a schematic sectional view of a ridge type semiconductor laser device according to an embodiment of the present invention.

FIG. 1 is a schematic sectional view of a ridge type semiconductor laser device according to an embodiment of the present invention, and shows a section perpendicular to the longitudinal direction of the device.

On a substrate 1, a lower cladding layer 2, an active layer 3 and an upper first cladding layer 4 are stacked in this order. On the upper first cladding layer 4, a ridge-shaped upper second cladding layer 7 is formed so as to extend in the longitudinal direction of the device (i.e. the direction perpendicular to the plane of FIG. 1). On both sides of the upper second cladding layer 7, current blocking layers 6 are formed. The current blocking layers 6 are formed along the side surfaces of the upper second cladding layer 7 and the upper surface of the upper first cladding layer 4. On the upper second cladding layer 7 and the current blocking layers 6, a contact layer 8 is formed in ohmic contact with the upper second cladding layer 7.

The substrate 1 is formed of an n-type GaAs compound semiconductor. The lower cladding layer 2 is formed of n-type $Al_{x1}Ga_{(1-x1)}$ As. The active layer 3 has a conductivity of n-type, P-type or undoped, and is formed of a single layer of $Al_{y1}Ga_{(1-y1)}$ As or a composite layer of two kinds of layers having different compositions. That is, the active layer 3 may be a MQW (Multi Quantum Well) active layer formed of alternately stacked $Al_{y11}Ga_{(1-y11)}$ As layers and $Al_{y12}Ga_{(1-y12)}$ As layers (y11≠y12), or a MQW active layer formed of alternately stacked $Al_{y1}Ga_{(1-y1)}$ As layers and GaAs layers. The upper first cladding layer 4 is formed of p-type $Al_{x2}Ga_{(1-x2)}$ As.

The upper second cladding layer 7 is formed of p-type $Al_{x3}Ga_{(1-x3)}$ As, and the current blocking layer 6 may be formed of n-type $Al_{y2}Ga_{(1-y2)}$ As or n-type GaAs. The contact layer 8 is formed of p-type GaAs.

On the lower surface of the substrate 1 and the upper surface of the contact layer 8, n-side electrodes and p-side electrodes (not shown) are formed respectively.

At the time of laser light emission, electrons recombine with holes to emit light. The laser light can pass through the lower cladding layer 2, the active layer 3, the upper first cladding layer 4 and the upper second cladding layer 7 which are formed of AlGaAs based materials. In these layers, the laser light is distributed in the form of a beam. The sectional form of a laser beam LB1 at the end face of the device is shown in FIG. 1.

The distance L1 from the lower surface of the active layer 3 to the lower surface of the lower cladding layer 2 is longer than the distance L2 from the upper surface of the active layer 3 to the upper surface of the upper second cladding layer 7.

Figure 3:
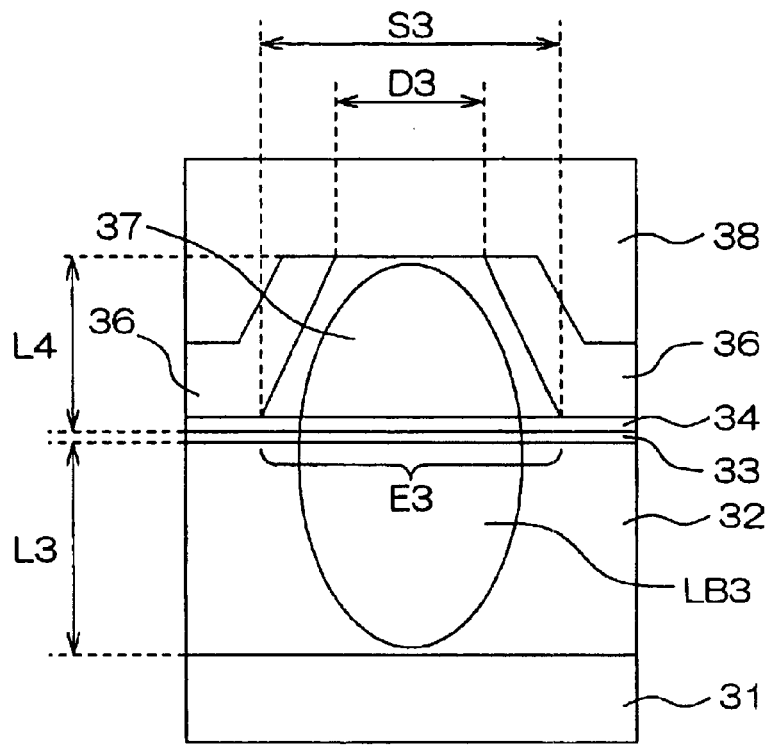
FIG. 3 is a schematic sectional view of a conventional ridge type semiconductor laser device.
Figure 4:
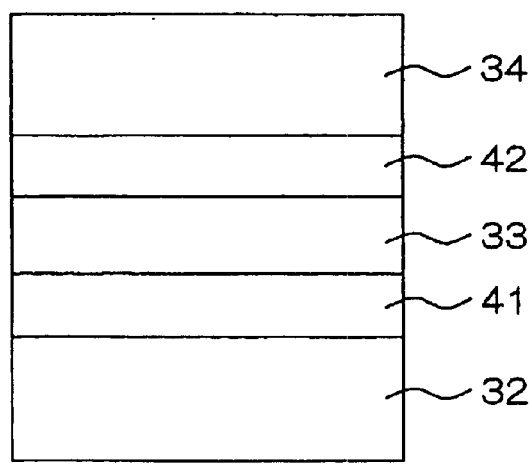
FIG. 4 is an enlarged schematic sectional view showing the structure in the vicinity of an active layer of the ridge type semiconductor laser device of FIG. 3.

The distance L2 is shorter than the conventional one (the distance L4 in FIG. 3). The lower surface width S1 (hereinafter referred to as "injection current width S1") of the upper second cladding layer 7 is set to be smaller (for example, 2~3 $\mu$m) than the diffusion length (for example, 3 $\mu$m) of carriers. That is, the injection current width S1 is smaller than that of the conventional device (the injection current width S3 in FIG. 3). The inclination angle of the side surface of the upper second cladding layer 7 is similar to that of the conventional one. With such a construction, the upper surface width D1 of the upper cladding layer 7 is similar to that of the conventional one (the width D3 of the upper surface in FIG. 3).

The distance L1 is longer than that of the conventional one (the distance L3 in FIG. 3). The thickness from the lower surface of the lower cladding layer 2 to the upper surface of the upper second cladding layer 7 is similar to that of the conventional device.

Figure 2:
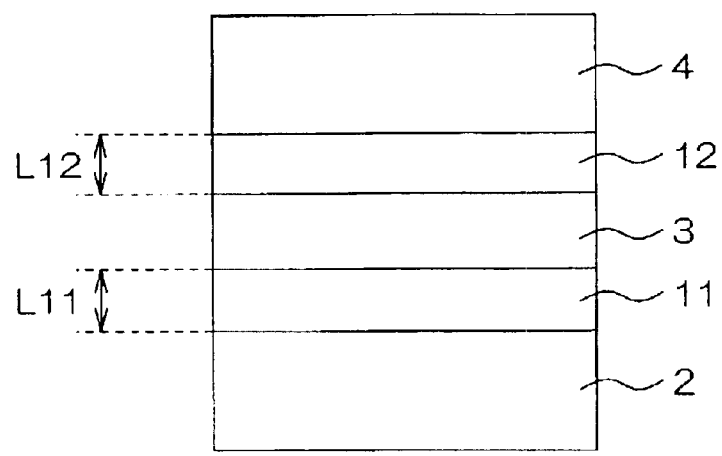
FIG. 2 is an enlarged schematic sectional view showing the structure in the vicinity of an active layer of the ridge type semiconductor laser device of FIG. 1.

FIG. 2 is an enlarged schematic sectional view showing the structure in the vicinity of an active layer of the ridge type semiconductor laser device of FIG. 1.

Between the lower cladding layer 2 and the active layer 3, a lower beam enlargement layer 11 is provided. Between the active layer 3 and the upper first cladding layer 4, an upper beam enlargement layer 12 is provided. The lower beam enlargement layer 11 is formed of n-type $Al_{z1}Ga_{(1-z1)}As$ and the upper beam enlargement layer 12 is formed of p-type $Al_{z2}Ga_{(1-z2)}As$. The thickness L11 of the lower beam enlargement layer 11 and the thickness L12 of the upper beam enlargement layer 13 are substantially equal to each other.

The Al content z1 of the lower beam enlargement layer 11 is higher than the Al content x1 of the lower cladding layer 2. In an AlGaAs based material, the higher the Al content becomes, the lower the refractive index becomes. Therefore, the refractive index of the lower beam enlargement layer 11 is lower than that of the lower cladding layer 2. In this case, by setting the refractive index of the lower beam enlargement layer 11 to a suitable value, the size of the laser beam LB1 is enlarged in the downward direction from the active layer 3 to have a suitable width. The smaller the difference between the refractive indexes of the lower beam enlargement layer 11 and the lower cladding layer 2 becomes, the smaller the downwardly enlarged width of the laser beam LB1 becomes.

The Al content z2 of the upper beam enlargement layer 12 is higher than the Al content x2 of the upper first cladding layer 4. Therefore, the refractive index of the upper beam enlargement layer 12 is lower than that of the upper first cladding layer 4. In this case, by setting the refractive index of the upper beam enlargement layer 12 to a suitable value, the size of the laser beam LB1 is enlarged by a suitable width in the upward direction from the active layer 3. The smaller the difference between the refractive indexes of the upper beam enlargement layer 12 and the upper first cladding layer 4 becomes, the smaller the upwardly enlarged width of the laser beam LB1 becomes. The refractive index of the upper beam enlargement layer 12 is larger than that of the lower beam enlargement layer 11.

The Al content x1 of the lower cladding layer 2, the Al content x2 of the upper first cladding layer 4 and the Al content x3 of the upper second cladding layer 7 may be equal to one another. That is, the refractive indexes of the lower cladding layer 2, the upper first cladding layer 4 and the upper second cladding layer 7 may be equal to one another. In this case, therefore, the difference between the refractive indexes of the lower cladding layer 2 and the lower beam enlargement layer 11 is larger than the difference between the refractive indexes of the upper first cladding layer 4 and the upper beam enlargement layer 12. As a result, at the time of laser light emission, the laser beam LB1 is distributed more widely in the downward direction than in the upward direction with respect to the active layer 3.

The refractive index of the lower beam enlargement layer 11 is so set that the lower end of the laser beam LB1 is positioned in the vicinity of the lower surface of the lower cladding layer 2 at the end face of the device. The refractive index of the upper beam enlargement layer 12 is so set that the upper end of the laser beam LB1 is positioned in the vicinity of the upper surface of the upper second cladding layer 7 at the end face of the device.

With the above-mentioned structure, the length from the lower end to the upper end of the laser beam LB1 (longitudinal beam diameter) can be similar to that of the conventional device, and an excellent laser beam LB1 can be obtained.

The current injection from the upper second cladding layer 7 into the active layer 3 occurs through the lower surface of the upper second cladding layer 7. Therefore, in the active layer 3, the recombination of electrons and carriers of holes causes light emission in a region E1 (hereinafter referred to as "light emission region E1") having a width substantially equal to the injection current width S1. In this case, carriers are not consumed uniformly throughout the light emission region E1 but consumed in larger amount in a portion in the vicinity of the center thereof in the direction of the width. However, since the injection current width S1 is smaller than the distribution length of the carriers, the portion in which a larger amount of carriers are consumed can be surely supplemented with carriers (especially minority carriers) so as to cause light emission uniformly throughout the light emission region E1, even in the case of high operation current. That is, with such a structure, the optical output can be stabilized, so that the maximum rated optical output of the laser device can be raised.

Further, since the upper surface width D1 of the upper second cladding layer 7 is similar to that of a conventional one (the upper surface width D3 in FIG. 3), the area of the boundary surface between the contact layer 8 and the upper second cladding layer 7 is similar to that of a conventional one. Therefore, the device resistance can be lowered to a value substantially equal to that of the conventional device.

In a process of manufacturing such a semiconductor laser device, after forming the lower cladding layer 2, only by continuously stacking a layer of AlGaAs based material with altering the Al content of the layer, the lower beam enlargement layer 11 can be formed. Similarly, after forming the upper first cladding layer 4, only by continuously stacking a layer of AlGaAs based material with altering the Al content of the layer, the upper beam enlargement layer 12 can be formed.

In addition to the upper first cladding layer 4 and the upper beam enlargement layer 12, other layers (for example, an etching stop layer used for forming the upper second cladding layer 7 into a ridge shape and the like) may be provided between the active layer 3 and the upper second cladding layer 7.

In the above-mentioned embodiment, though the refractive indexes of the lower beam enlargement layer 11 and the upper beam enlargement layer 12 are set to suitable values respectively in order to adjust the distribution of the laser beam LB1, the thickness L11 of the lower beam enlargement layer 11 and the thickness L12 of the upper beam enlargement layer 12 may be set to suitable values respectively. That is, if the refractive indexes of the lower beam enlargement layer 11 and the upper beam enlargement layer 12 are fixed, the enlarged width of the laser beam LB1 becomes large when the thicknesses L11, L12 thereof are large. Therefore, by setting the refractive indexes of the lower beam enlargement layer 11 and the upper beam enlargement layer 12, for example, to an equal value and setting the thickness L11 of the lower beam enlargement layer 11 to be larger than the thickness L12 of the upper beam enlargement layer 12, the laser beam LB1 can be distributed more widely in the downward direction than in the upward direction with respect to the active layer 3.

Though the above-mentioned semiconductor laser device is an AlGaAs based one, it may be an InGaAlP based one.

EXAMPLE

Shown in Table 1 are the ridge heights (the thicknesses of the upper second cladding layers 7, 37) and the device resistances of the ridge-type semiconductor laser device according to an embodiment of the present invention and a conventional semiconductor laser device respectively.

In each of the devices, the injection current width S1, S3 are so set that the stable output can accomplish 200 mW.

In the conventional ridge-type semiconductor laser device (comparison), the device resistance shows so high a value as 8.0 Ω, because the upper surface width D3 is small. On the contrary, in the embodiment of the present invention, since the ridge height is reduced to 1.9 μm in comparison with the conventional value 2.3 μm and the upper surface width D1 becomes larger in accordance therewith, the device resistance is as low as 3.5.

TABLE 1

|  | Ridge Height (μm) | Device resistance (Ω) |
|---|---|---|
| Embodiment | 1.9 | 3.5 |
| Comparison | 2.3 | 8.0 |

Although the present invention has been described and illustrated in detail, it is clearly understood that the same is by way of illustration and example only and is not to be taken by way of limitation, the spirit and scope of the present invention being limited only by the terms of the appended claims.

This application corresponds to a Japanese Patent Application No. 2001-245641 filed in the Japanese Patent Office on Aug. 13, 2001, and the whole disclosure of this Japanese application is incorporated herein by reference.

What is claimed is:

1. A semiconductor laser device comprising:
   a lower cladding layer formed on a compound semiconductor substrate;
   an active layer stacked on the lower cladding layer;
   an upper first cladding layer stacked on the active layer;
   a ridge-shaped upper second cladding layer provided on the upper first cladding layer;
   current blocking layers provided on both sides of the upper second cladding layer; and
   a contact layer provided on the upper second cladding layer;
   wherein a distance between an upper surface of the active layer and a lower surface of the contact layer above the upper second cladding layer is shorter than a distance between a lower surface of the lower cladding layer and a lower surface of the active layer, and
   wherein a width of a bottom surface of the upper second cladding layer is smaller than a carrier diffusion length in the active layer.

2. A semiconductor laser device as claimed in claim 1, further comprising a lower beam enlargement layer provided between the lower cladding layer and the active layer and having a refractive index lower than each of refractive indexes of the lower cladding layer and the active layer.

3. A semiconductor laser device as claimed in claim 2, further comprising an upper beam enlargement layer provided between the active layer and the upper first cladding layer and having a refractive index lower than each of refractive indexes of the active layer and the upper first cladding layer.

4. A semiconductor laser device as claimed in claim 3, wherein a difference between the refractive indexes of the lower cladding layer and the lower beam enlargement layer is larger than a difference between the refractive indexes of the upper first cladding layer and the upper beam enlargement layer.

5. A semiconductor laser device as claimed in claim 3, wherein a thickness of the lower beam enlargement layer is larger than that of the upper beam enlargement layer.

6. A semiconductor laser device as claimed in claim 4, wherein:
   the compound semiconductor substrate is a GaAs compound semiconductor substrate;
   the lower cladding layer is an $Al_{x1}Ga_{(1-x1)}$ As layer; the active layer is a single layer of $Al_{y1}Ga_{(1-y1)}$ As, a composite layer of an $Al_{y11}Ga_{(1-y11)}$ As layer and an $Al_{y12}Ga_{(1-y12)}$ As layer, or a composite layer of an As layer and a GaAs layer;
   the upper first cladding layer is an $Al_{x2}Ga_{(1-x2)}$ As layer;
   the ridge-shaped upper second cladding layer is an $Al_{x3}Ga_{(1-x3)}$ As layer;
   the current blocking layer is an $Al_{y2}Ga_{(1-y2)}$ As layer or a GaAs layer;
   the contact layer is a GaAs layer;
   the lower beam enlargement layer is an $Al_{z1}Ga_{(1-z1)}$ As layer;
   the upper beam enlargement layer is an $Al_{z2}Ga_{(1-z2)}$ As layer; and
   parameters x1, x2, x3, y1, y2, y11, y12, z1 and z2 each have a value between 0 and 1.

7. A semiconductor laser device as claimed in claim 1, wherein:
   the compound semiconductor substrate is a GaAs compound semiconductor substrate; the lower cladding layer is an $Al_{x1}Ga_{(1-x1)}$ As layer;
   the active layer is a single layer of $Al_{y1}Ga_{(1-y1)}$ As, a composite layer of an $Al_{y11}Ga_{(1-y11)}$As layer and an $Al_{y12}Ga_{(1-y12)}$ As layer, or a composite layer of an $Al_{y1}Ga_{(1-y1)}$As layer and a GaAs layer;
   the upper first cladding layer is an $Al_{x2}Ga_{(1-x2)}$ As layer;
   the ridge-shaped upper second cladding layer is an $Al_{x3}Ga_{(1-x3)}$ As layer;
   the current blocking layer is an $Al_{y2}Ga_{(1-y2)}$ As layer or a GaAs layer;
   the contact layer is a GaAs layer; and
   parameters x1, x2, x3, y1, y2, y11 and y12 each have a value between 0 and 1.

8. A semiconductor laser device, comprising:
   a lower cladding layer formed on a compound semiconductor substrate;
   an active layer stacked on the lower cladding layer;
   an upper first cladding layer stacked on the active layer;
   a ridge-shaped upper second cladding layer provided on the upper first cladding layer;
   current blocking layers provided on both sides of the upper second cladding layer; and
   a contact layer provided on the upper second cladding layer;
   wherein the semiconductor laser device is adapted to produce at the time of laser light emission a laser beam in the upper second cladding layer, the laser beam being distributed more widely in the downward direction than in the upward direction with respect to the active layer.

9. A semiconductor laser device as claimed in claim 8, wherein the semiconductor laser device is adapted to produce at the time of laser light emission a laser beam having an upper edge located below the upper surface of the upper second cladding layer.

* * * * *